United States Patent
Muthukamatchy et al.

(10) Patent No.: US 11,883,958 B2
(45) Date of Patent: Jan. 30, 2024

(54) ROBOT APPARATUS INCLUDING DUAL END EFFECTORS WITH VARIABLE PITCH AND METHODS

(71) Applicant: Applied Materials, Inc., Santa Clara, CA (US)

(72) Inventors: Karuppasamy Muthukamatchy, Madurai (IN); Rajkumar Thanu, Santa Clara, CA (US); Eran Weiss, Sunnyvale, CA (US); Jeffrey C. Hudgens, San Francisco, CA (US); Chandrakant M. Sapkale, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 1072 days.

(21) Appl. No.: 16/434,886

(22) Filed: Jun. 7, 2019

(65) Prior Publication Data
US 2020/0384634 A1     Dec. 10, 2020

(51) Int. Cl.
| | |
|---|---|
| H01L 21/677 | (2006.01) |
| B25J 9/00 | (2006.01) |
| B25J 9/10 | (2006.01) |
| B25J 9/16 | (2006.01) |
| H01L 21/02 | (2006.01) |

(52) U.S. Cl.
CPC ............. *B25J 9/0087* (2013.01); *B25J 9/109* (2013.01); *B25J 9/161* (2013.01); *H01L 21/0201* (2013.01); *H01L 21/02104* (2013.01); *H01L 21/67742* (2013.01); *H01L 21/67754* (2013.01)

(58) Field of Classification Search
None
See application file for complete search history.

(56) References Cited

U.S. PATENT DOCUMENTS

| | | | |
|---|---|---|---|
| 8,007,218 B2* | 8/2011 | Park | H01L 21/67742 414/217 |
| 8,033,769 B2* | 10/2011 | Gage | H01L 21/67196 414/217 |
| 8,784,033 B2* | 7/2014 | Kremerman | H01L 21/67742 414/744.5 |
| 9,054,146 B2* | 6/2015 | Wi | H01L 21/68707 |
| 9,076,830 B2* | 7/2015 | Kremerman | H01L 21/67742 |
| 9,117,865 B2* | 8/2015 | Hudgens | H01L 21/67742 |
| 9,302,395 B2* | 4/2016 | Ando | B25J 11/0095 |
| 9,623,555 B2* | 4/2017 | Krupyshev | B25J 9/042 |
| 10,500,719 B2* | 12/2019 | Muthukamatchi | H01L 21/67742 |
| 10,629,472 B2 | 4/2020 | Hosek et al. | |

(Continued)

*Primary Examiner* — Michael S Lowe
(74) *Attorney, Agent, or Firm* — Lowenstein Sandler LLP (57) ABSTRACT

A robot apparatus may include an upper arm adapted to rotate about a first rotational axis and a forearm rotatably coupled to the upper arm at a second rotational axis. A first wrist member may be rotatably coupled to the forearm at a third rotation axis. A second wrist member may be rotatably coupled to the forearm at the third rotation axis. A first end effector may be coupled to the first wrist member and a second end effector may be coupled to the second wrist member. The first wrist member and the second wrist member may be configured to rotate about the third rotational axis between a first pitch and a second pitch as a function of extension of the robot apparatus. Other apparatus and methods are disclosed.

18 Claims, 7 Drawing Sheets

(56) References Cited

U.S. PATENT DOCUMENTS

| | | |
|---|---|---|
| 10,710,819 B1 | 6/2020 | Thanu et al. |
| 10,950,484 B2 | 3/2021 | Hosek |
| 11,024,531 B2 | 6/2021 | Nordin et al. |
| 2001/0033788 A1 | 10/2001 | Pietrantonio |
| 2002/0061248 A1* | 5/2002 | Tepman ................ C23C 14/568 |
| | | 414/744.5 |
| 2011/0311339 A1 | 12/2011 | Yasui et al. |
| 2014/0286741 A1 | 9/2014 | Kremerman et al. |
| 2016/0064263 A1 | 3/2016 | Hosek et al. |
| 2020/0399077 A1 | 12/2020 | Thanu et al. |

* cited by examiner

ROBOT APPARATUS INCLUDING DUAL END EFFECTORS WITH VARIABLE PITCH AND METHODS

FIELD

Embodiments of the present application relate to electronic device processing devices and methods with a robot apparatus including dual end effectors.

BACKGROUND

Processing of substrates in semiconductor electronic device manufacturing may require a combination of different processes applied in the same substrate processing system. For example, the processes may include chemical vapor deposition/atomic layer deposition (CVD/ALD) and physical vapor deposition (PVD) applied within the same platform. These processes may be applied using different configurations of processing chambers coupled to a transfer chamber. Robots are located in the transfer chamber and are configured to move substrates between the respective processing chambers.

SUMMARY

In some embodiments, a robot apparatus is disclosed. The robot apparatus includes an upper arm adapted to rotate about a first rotational axis; a forearm rotatably coupled to the upper arm at a second rotational axis, the second rotational axis spaced from the first rotational axis; a first wrist member rotatably coupled to the forearm at a third rotation axis, the third rotational axis spaced from the second rotational axis; a first end effector coupled to the first wrist member; a second wrist member rotatably coupled to the forearm at the third rotation axis; a second end effector coupled to the second wrist member; the first wrist member and the second wrist member configured to provide for a first end effector distance between the first end effector and the second end effector while extended a first distance from the first rotational axis; and the first wrist member and the second wrist member configured to rotate about the third rotational axis to a second pitch providing for a second end effector distance between the first end effector and the second end effector while extended a second distance from the first rotational axis.

In some embodiments, an electronic device processing system is disclosed. The electronic device processing system includes a transfer chamber including a plurality of facets, one or more of the plurality of facets including dual openings with centers separated by an opening distance; one or more process chambers coupled to the plurality of facets, one or more of the process chambers including dual processing locations having centers separated by a processing distance, the processing distance being greater than the opening distance; a robot apparatus at least partially enclosed within the transfer chamber, the robot apparatus including: an upper arm adapted to rotate about a first rotational axis; a forearm rotatably coupled to the upper arm at a second rotational axis, the second rotational axis spaced from the first rotational axis; a first wrist member rotatably coupled to the forearm at a third rotation axis, the third rotational axis spaced from the second rotational axis; a first end effector coupled to the first wrist member; a second wrist member rotatably coupled to the forearm at the third rotation axis; a second end effector coupled to the second wrist member; wherein the first wrist member and the second wrist member configured to provide a first pitch providing for a first end effector distance between the first end effector and the second end effector that is approximately equal to the opening distance while extended a first distance from the first rotational axis; and the first wrist member and the second wrist member configured to rotate about the third rotational axis to a second pitch providing for a second end effector distance between the first end effector and the second end effector that is approximately equal to the processing distance while extended a second distance from the first rotational axis.

In some embodiments, a method of operating a robot apparatus is provided. The method includes rotating an upper arm about a first rotational axis; rotating a forearm relative to the upper arm and about a second rotational axis spaced from the first rotational axis; rotating a first wrist member coupled to a first end effector and a second wrist member coupled to a second end effector relative to the forearm and about a third rotational axis spaced form the second rotational axis to a first end effector distance between the first end effector and the second end effector; and rotating the first wrist member and the second wrist member about the third rotational axis to a second end effector distance.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Reference will now be made in detail to the example embodiments provided, which are illustrated in the accompanying drawings. Features of the various embodiments described herein may be combined with each other unless specifically noted otherwise.

Electronic device processing systems may need to implement a combination of multiple substrate manufacturing processes. These substrate manufacturing processes may include chemical vapor deposition/atomic layer deposition (CVD/ALD) and physical vapor deposition (PVD). The electronic device processing systems may include a variety of different process chambers and load lock chambers to implement the combination of multiple substrate manufacturing processes. These process chambers and load lock chambers may include dual processing locations on which substrates are positioned for processing. Centers between dual processing locations in different process chambers and load lock chambers may be separated by different distances (e.g., pitches) depending on the type of manufacturing process to be implemented within each process chamber.

A robot apparatus with dual end effectors may be implemented to position substrates on and to remove substrates from dual processing locations simultaneously. However, dual end effectors positioned at a fixed pitch that is different than dual process locations within a chamber may cause throughput deficiencies while accessing the dual processing locations. Thus, in accordance with embodiments described herein, a robot apparatus with variable end effector pitch is provided.

In one or more embodiments described herein, a robot apparatus with variable end effector pitch is disclosed. The robot apparatus may include an upper arm adapted to rotate about a first rotational axis (e.g., a shoulder axis). A forearm may be coupled to the upper arm at a second rotational axis that is spaced from the first rotational axis. A first wrist member may be coupled to the forearm at a third rotational axis that is spaced from the second rotation axis. A first end effector may be coupled to the first wrist member. A second wrist member may also be coupled to the forearm at the third rotational axis. A second end effector may be coupled to the second end effector.

The first wrist member and the second wrist member are configured to rotate about the third rotational axis between at least a first end effector distance (e.g., pitch) and a second end effector distance. In some embodiments, the first and second wrist members rotate to the first end effector distance when the first end effector and the second end effector are extended a first distance from the first rotational axis. The first and second wrist members may rotate to the second end effector distance when the first end effector and the second end effector are extended a second distance from the first rotational axis.

Further details of example embodiments of various robots, substrate processing systems, and methods are described with reference to FIGS. 1-5 herein.

Figure 1:
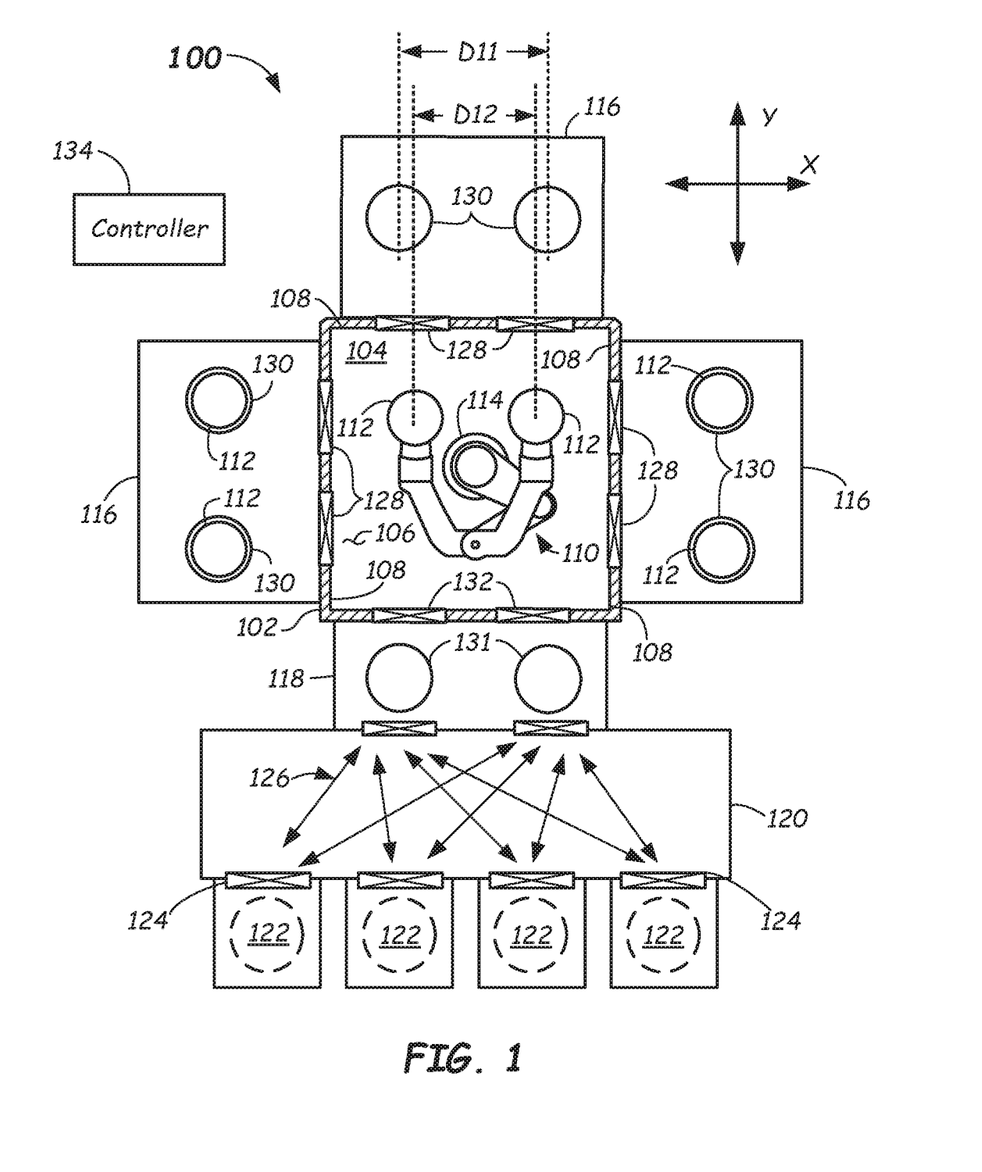
FIG. 1 illustrates a schematic, top view of a substrate processing system (with lids removed) including a changeable pitch robot apparatus according to the disclosed embodiments.

FIG. 1 illustrates a schematic top view of a substrate processing system 100 including a robot apparatus 110 according to the disclosed embodiments. The substrate processing system 100 may include a transfer chamber 104 within a main frame 102. The transfer chamber 104 may include a plurality of facets 108 and a floor 106. The transfer chamber 104 may be maintained in a vacuum. The robot apparatus 110 may be received at least partially within the transfer chamber 104 and may be adapted to be operable therein. The robot apparatus 110 may include a base 114 adapted to be attached to a wall (e.g., the floor 106) of the main frame 102 that forms a part of the transfer chamber 104. The robot apparatus 110 may be adapted to pick and/or place substrates 112 (sometimes referred to as "wafers" or "semiconductor wafers") to or from destinations. The destinations may be chambers coupled to the transfer chamber 104. For example, the destination may be one or more process chambers 116 and/or one or more load lock chambers 118 coupled to the plurality of facets 108 of the transfer chamber 104.

The process chambers 116 may be adapted to carry out any number of process steps on the substrates 112, such as deposition, oxidation, nitration, etching, polishing, cleaning, lithography, or the like. The one or more load lock chambers 118 may be adapted to interface with a factory interface 120. The factory interface 120 may receive substrates 112 from substrate carriers 122 (e.g., Front Opening Unified Pods (FOUPs)) docked at load ports 124 of the factory interface 120. Another robot (not shown) may be used to transfer substrates 112 between the substrate carriers 122 and the one or more load lock chambers 118 as shown by arrows 126. Transfers may be carried out in any sequence or order.

One or more of the plurality of process chambers 116 may include processing locations 130 (e.g., dual processing locations) on which substrates 112 may be placed for processing. The processing locations 130 within each of the plurality of process chambers 116 may have centers that are spaced by a processing distance D11.

The processing locations 130 within a process chamber 116 may be accessed by the robot apparatus 110 through dual slit valves 128 in the plurality of facets 108. Each of the plurality of processing chambers 116 may be affixed to a corresponding facet 108 such as to align with one set of dual slit valves 128. Each of the plurality of the dual slit valves 128 may have centers that are separated by an opening distance D12. The processing distance D11 and the opening distance D12 may be different. For example, the processing distance D11 may be greater than the opening distance D12.

In some embodiments, the opening distance D12 is in a range from 0.45 m to 0.65 m and the processing distance D12 is in a range from 0.60 m to 0.90 m. In other embodiments, the opening distance D12 is about 22 inches (about 0.56 m) and the processing distance D11 is about 28 inches (about 0.70 m). The opening distance D12 and the processing distance D11 may have other values.

The one or more load lock chambers 118 may include transfer locations 131 (e.g. dual transfer locations) on which substrates 112 may be placed for transfer into and out of the transfer chamber 104. In some embodiments, the transfer locations 131 within the load lock chamber 118 may be accessed by the robot apparatus 110 through slit valves 132 located in one or more of the plurality of facets 108. The load lock chamber 118 may be affixed to a facet 108 such as to align with slit valves 132. The slit valves 132 may have a width that provides for simultaneous access to the transfer locations 131 within the load lock chamber 118 by the robot apparatus 110.

A controller 134 may be in communication with the robot apparatus 110. The robot apparatus 110 may be controlled by suitable commands generated by the controller 134. The controller 134 may also generate commands to control the dual slit valves 128 and the slit valves 132.

Figure 2A:
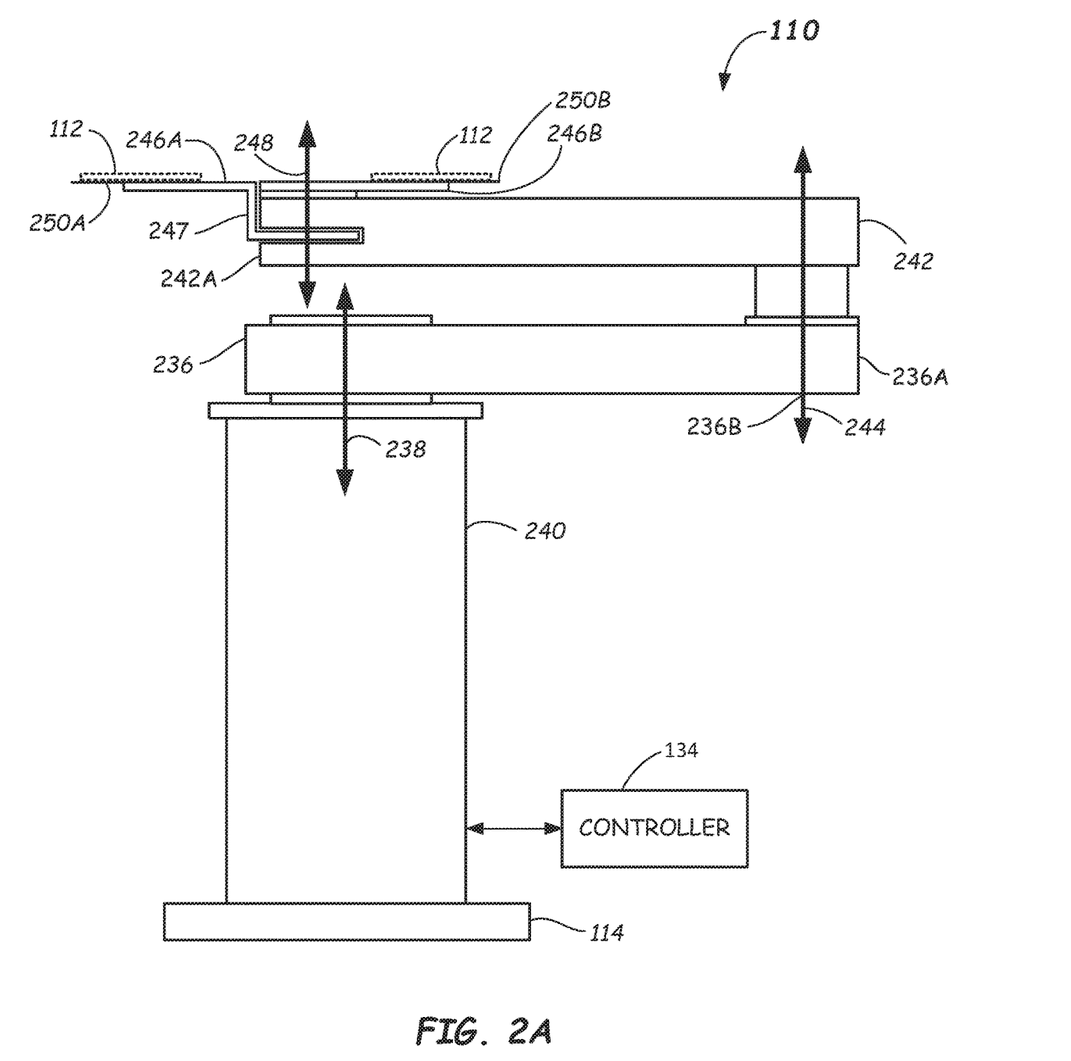
FIG. 2A illustrates a side view of a robot apparatus according to the disclosed embodiments.

FIG. 2A illustrates a side view of an embodiment of the robot apparatus 110 according to the disclosed embodiments. The robot apparatus 110 may include an upper arm 236, which, in the depicted embodiment, may be a substantially rigid cantilever beam. The upper arm 236 may be adapted to be independently rotated about a first rotational axis 238 in clockwise and counterclockwise rotational directions in an X-Y plane (FIG. 1) relative to the base 114. The rotation about the first rotational axis 238 may be provided by a suitable driving mechanism, such as an upper arm drive motor (not shown) that may be received in a motor housing 240. The drive motor may be a conventional variable reluctance or permanent magnet electric motor, for example. The rotation of the upper arm 236 may be controlled by suitable commands transmitted to the upper arm drive motor from the controller 134.

A forearm 242 may be mounted and rotationally coupled to an outboard end 236A of the upper arm 236, at a radial position 236B spaced from the first rotational axis 238. The forearm 242 may be adapted to be rotated in the X-Y plane (FIG. 1) relative to the upper arm 236 about a second rotational axis 244 located at the radial position 236B.

A first wrist member 246A may be rotatably coupled to an outboard end 242A of the forearm 242 at a third rotational axis 248 spaced from the second rotational axis 244. The first wrist member 246A may be adapted for independent rotation in the X-Y plane relative to the forearm 242 about the third rotational axis 248. A second wrist member 246B may be rotatably coupled to the outboard end 242A of the forearm 242 at the third rotational axis 248 and above the first wrist member 246A. The second wrist member 246B may be adapted for independent rotation in the X-Y plane relative to the forearm 242 about the third rotational axis 248. The first wrist member 246A may include a bend 247 at a longitudinal end coupled to the forearm 242. The bend 247 may enable the first wrist member 246A and the second wrist member 246B to be at the same height and on the same plane.

The first wrist member 246A may be coupled to a first end effector 250A. Similarly, the second wrist member 246B may be coupled to a second end effector 250B. Both the first end effector 250A and the second end effector 250B (sometimes referred to as "blades") may be adapted to carry and transport substrates 112 during pick and/or place operations. The first end effector 250A and the second end effector 250B may be of any suitable construction.

The first end effector 250A and the second end effector 250B may be passive or may include some active devices for holding the substrates 112. Active devices include mechanical clamps or electrostatic devices. The first end effector 250A may be coupled to the first wrist member 246A and the second end effector 250B may be coupled to the second wrist member 246B by any suitable means, such as mechanical fastening, adhering, clamping, etc. In some embodiments, the first end effector 250A and the first wrist member 246A may be one integral piece. Similarly, the second end effector 250B and the second wrist member 246B may be one integral piece.

Figure 2B:
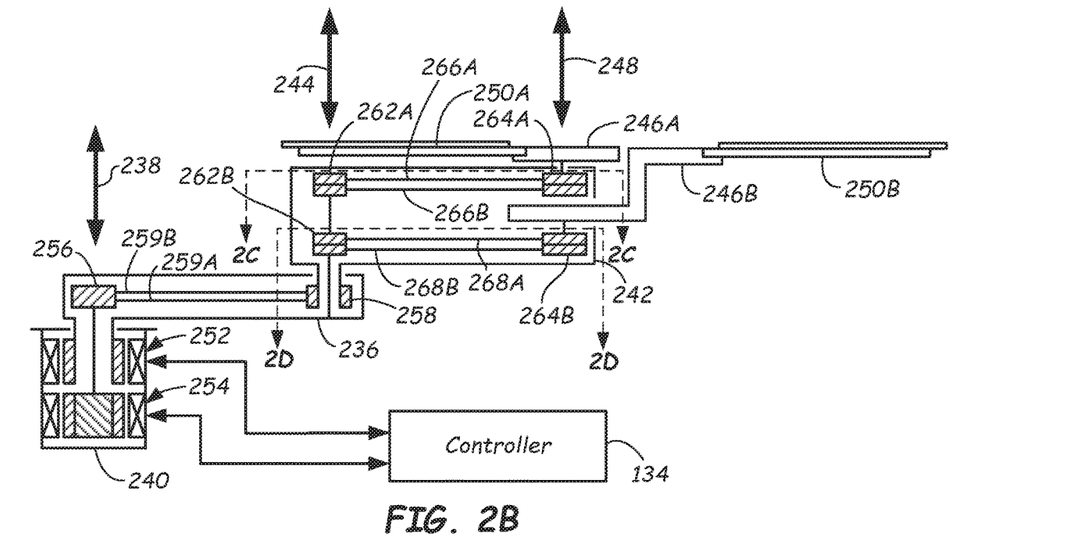
FIG. 2B illustrates a cross-sectioned, side view of a robot apparatus according to the disclosed embodiments.

FIG. 2B illustrates a cross-sectional side view of an embodiment of the robot apparatus 110 according to the disclosed embodiments. The motor housing 240 may include a first motor 252 and a second motor 254. The first motor 252 may be adapted to rotate the upper arm 236 about the first rotational axis 238 in the X-Y plane relative to the motor housing 240.

The second motor 254 may be adapted to rotate the forearm 242 about the second rotational axis 244 relative to the upper arm 236. The second motor 254 may include a stator fixedly mounted to the motor housing 240 and a rotor coupled to a forearm drive member 256. In operation, rotation of the forearm drive member 256 by the second motor 254 causes a forearm driven member 258 coupled to the forearm 242 to rotate about the second rotational axis 244 in the X-Y plane (FIG. 1). A drive element 259A, 259B, which may be any suitable drive connector such as a belt or collection of belts, drive shaft, chains, etc., may connect between the forearm drive member 256 and the forearm driven member 258. In some embodiments, the drive element 259A, 259B is (as schematically shown) comprised of multiple metal straps or bands connected (e.g., pinned) to the forearm drive member 256 and the forearm driven member 258 one above the other, as is conventional.

The forearm driven member 258 may include a pilot shaft mounted to a first wrist drive member 262A and a second wrist drive member 262B. In operation, rotation of the upper arm 242 by the forearm driven member 258 and fixation of the pilot shaft to the forearm 236 causes rotation of the first wrist member 246A to rotate about the third rotational axis 248. A drive element 266A, 266B, which may be any suitable drive connector, may connect between a first wrist drive member 262A and the first wrist driven member 264A. In some embodiments, the drive element 266A, 266B is comprised of metal straps connected (e.g., pinned) to the first wrist drive member 262A and the first wrist driven member 264A as shown in FIG. 2C.

Rotation of the second wrist member 246B by the rotation of the forearm 236 is causes, like for the first wrist member 246A, caused by kinematic connection between a second wrist drive member 262B and a second wrist driven member 264B. This causes the second wrist member 246B to rotate about the third rotational axis 248. A drive element 268, which may be any suitable drive connector such as a belt, drive shaft, etc., may connect between the second wrist drive member 262B and the second wrist driven member 264B. In some embodiments, the drive element 268A, 268B is comprised of metal straps connected (e.g., pinned) to the second wrist drive member 262B and the second wrist driven member 264B as shown in FIG. 2D.

Figure 2C:
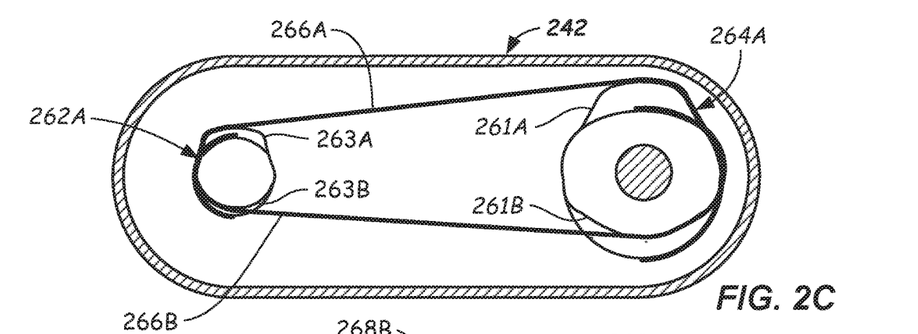
FIG. 2C illustrates a top, cross-sectioned view of a forearm of a robot apparatus taken through section 2C-2C according to the disclosed embodiments.
Figure 2D:
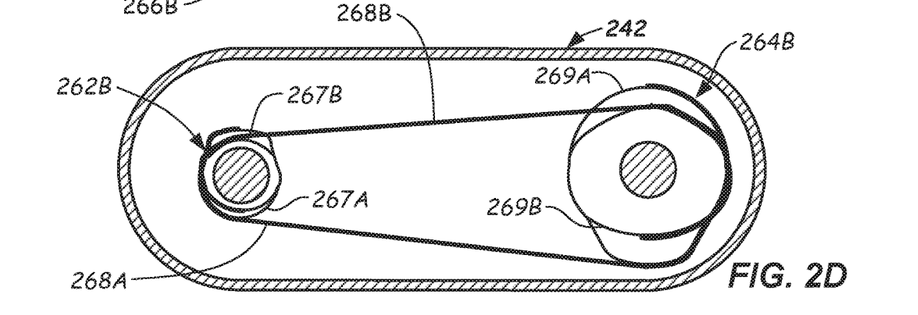
FIG. 2D illustrates a top, cross-sectioned view of a forearm of a robot apparatus taken through section 2D-2D according to the disclosed embodiments.

In more detail, FIG. 2C illustrates a top cross-sectioned view an embodiment of the forearm 242 of the robot apparatus 110 according to the disclosed embodiments. FIG. 2D illustrates a top, cross-sectioned view of the forearm 242 of the robot apparatus 110 according to the disclosed embodiments. The first wrist drive member 262A may comprise two oblong pulleys 263A, 263B including cam profiles implemented to transition the first wrist member 246A between the first pitch and the second pitch as a function of the extension of the robot 110. The pulleys 263A, 263B of the first wrist drive member 262A may include different cam surfaces. The first wrist driven member 264A may also include pulleys 261A, 261B that include cam surfaces. The pulleys 263A, 263B and the pulleys 261A, 261B may each include a lobe, wherein the lobes are the maximum radii of the first wrist drive member 262A and the first wrist driven member 264A. The lobes of the pulleys 261A, 263A and the pulleys 261B, 263B may be oriented in the same directions. A first drive element 266A (e.g., first belt) may couple the pulley 263A to the pulley 261A and a second drive element 266B (e.g., belt) may couple the pulley 263B to the pulley 261B.

The second wrist drive member 262B may comprise two oblong pulleys 267A, 267B implemented to transition the second wrist member 246B between the first pitch and the second pitch, such that the first wrist member 246A and the second wrist member 246B separate from one another as a function of extension of the robot. The pulleys 267A, 267B of the second wrist drive member 262B may include different cam surfaces. The second wrist driven member 264B may also include pulleys 269A, 269B that include cam surfaces. The pulleys 267A, 267B and the pulleys 269A, 269B may each include a lobe. As in the previous case, the lobes of the pulleys 267A, 267B may be oriented 90°. Likewise, lobes of the pulleys 269A, 269B may be oriented 90° from each other. A first belt 268A may couple the pulley 267A to the pulley 269A and a second belt 268B may couple the pulley 267B to the pulley 267B. Other lobe shapes and orientations may be used. In some embodiments, the lobe profile is designed such that the locations of the first end effector 250A and the second end effector 250B transition between the first pitch and the second pitch as they approach or recede from the dual processing locations 130 (FIG. 1) within each of the one or more process chamber 116 or within each of the one or more load lock chambers 118.

Figure 2E:
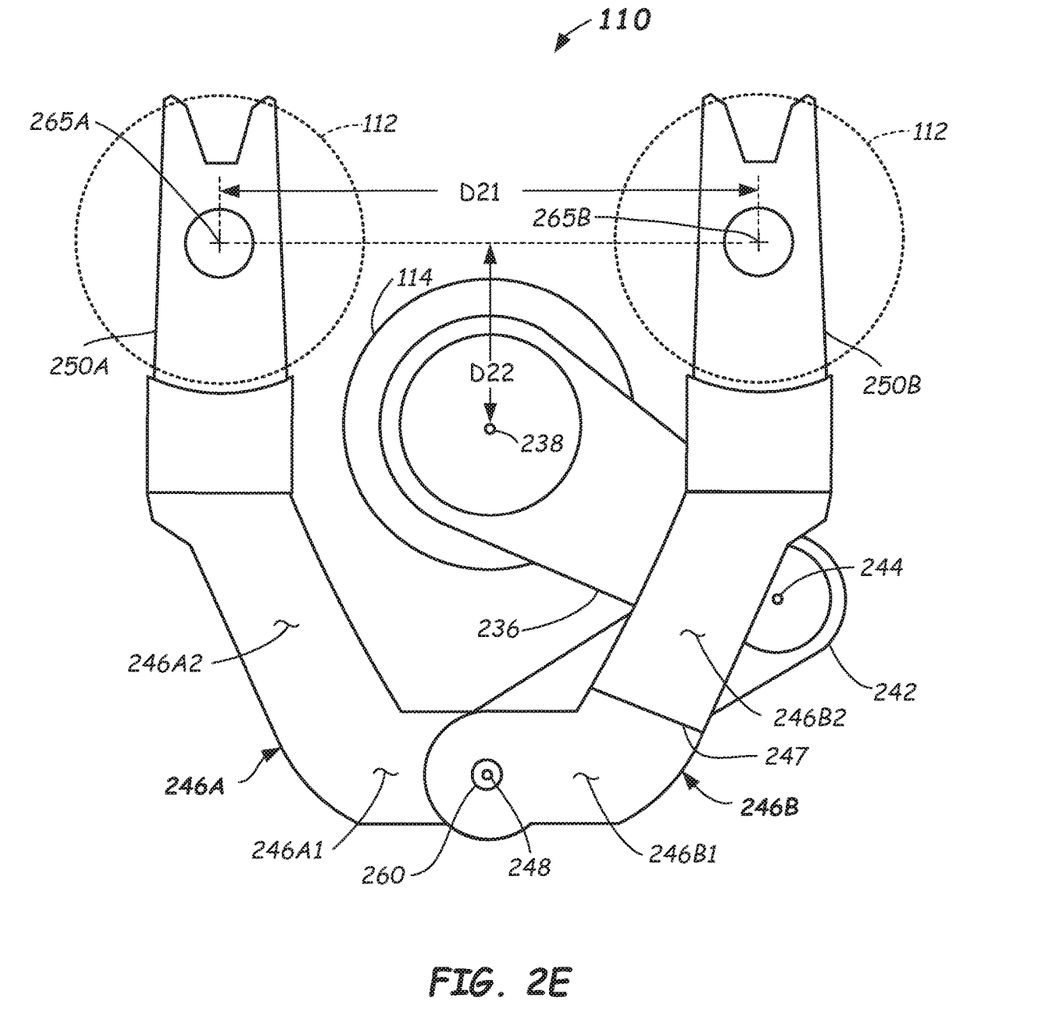
FIG. 2E illustrates a top plan view of a robot apparatus according to the disclosed embodiments.

FIG. 2E illustrates a top plan view of the robot apparatus 110 according to the disclosed embodiments. The first wrist member 246A and the second wrist member 246B may be L-shaped. The first wrist member 246A may include a first leg 246A1 and a second leg 246A2. The first leg 246A1 may be rotatably coupled to the forearm 242 about the third rotational axis 248 at a rotation point 260. The second leg 246A2 may be longer than the first leg 246A1 and may be coupled to the first end effector 250A.

The second wrist member 246B may include a first leg 246B1 and a second leg 246B2. The first leg 246B1 may be rotatably coupled to the forearm 242 about the third rotational axis 248 at the rotation point 260. The second leg 246B2 may be longer than the first leg 246B1 and may be coupled to the second end effector 250B. The first leg 246B1 may include the bend 247 that provides for the vertical alignment of the first and second end effectors 250A, 250B in the same X-Y plane.

The embodiment of the robot apparatus 110 shown in FIGS. 2A-2E may be adapted for use in the substrate processing system 100 of FIG. 1. In operation, the upper arm 236 may be rotated so as to position the first end effector 250A and the second end effector 250B adjacent a desired destination (e.g., a process chamber 116 or the load lock chamber 118) to pick or place a substrate 112. The upper arm 236 and the forearm 242 then may be suitably actuated (e.g., rotated) to extend the first wrist member 246A and the second wrist member 246B to or from the desired destination. As the first wrist member 246A and the second wrist member 246B move from the first rotational axis 238, the first wrist member 246A and the second wrist member 246B may rotate in opposite directions about the third rotational axis 248. The center of the nominal substrate placement locations on the first end effector 250A and the second end effector 250B are separated by a distance D21, which may be dependent on a distance D22 between the first end effector 250A and the second end effector 250B and the first rotational axis 238.

The first end effector 250A and the second end effector 250B may be inserted into each process chamber 116 simultaneously through the dual slit valves 128 (FIG. 1) in a straight line manner, i.e., inserted in a direction substantially perpendicular to a facet 108 of a process chamber 116. While passing through the dual slit valves 128, the first end effector 250A and the second end effector 250B may be at a first pitch that provides for a first separation distance D21 between nominal substrate placement centers of the first and second end effectors 250A, 250B. This first separation distance D21 may match the opening offset distance D12 of the dual slit valves 128.

Once through the dual slit valves 128, the first and second end effectors 250A, 250B may be rotated apart about the third rotational axis 248 to a second pitch that provides for a second separation distance D21' between the nominal substrate placement centers of the first and second end effectors 250A, 250B. For example, the first wrist member 246A and the second wrist member 246B may rotate about the third rotational axis 248 via the rotation point 260. This second separation distance D21' may match the processing distance D11 of the dual processing locations 130 (FIG. 1) within the process chamber 116, which is wider than D12.

Similarly, the first and second end effectors 250A, 250B may be inserted simultaneously into the load lock chamber 118 (FIG. 1) through the slit valves 132 in a straight line manner. While passing through the slit valves 132, the first and second end effectors 250A, 250B may be at the first pitch. For example, the distance D21 may have a first value. Once through the slit valves 132, the first and second end effectors 250A, 250B may remain at the first pitch or be rotated outward to the second pitch. For example, the first wrist member 246A and the second wrist member 246B may rotate about the third rotational axis 248 via the rotation point 260 to a second value of the distance D21'. The second value of the distance D21' may be selected to be approximately a same separation distance between centers of the dual transfer locations 131 within the load lock chamber 118. The processes described above may be applied in reverse order as the first end effector 250A and the second end effector 250B are retracted from a process chamber 116 or the load lock chamber 118.

The substrate processing system 100 may be described by the first wrist member 246A and the second wrist member 246B configured to rotate the first and second end effectors 250A, 250B to a first pitch providing for a first end effector distance D21 between the first end effector 250A and the second end effector 250B while a first distance D22 from the first rotational axis 238. The first wrist member 246A and the second wrist member 246B may rotate in opposite directions to a second pitch providing for a second end effector distance D21' between the first end effector 250A and the second end effector 250B while extended a second distance D22' from the first rotational axis 238. Accordingly, the distance D21' may be dependent on the distance D22' and kinematically determined by the cams.

Figure 3A:
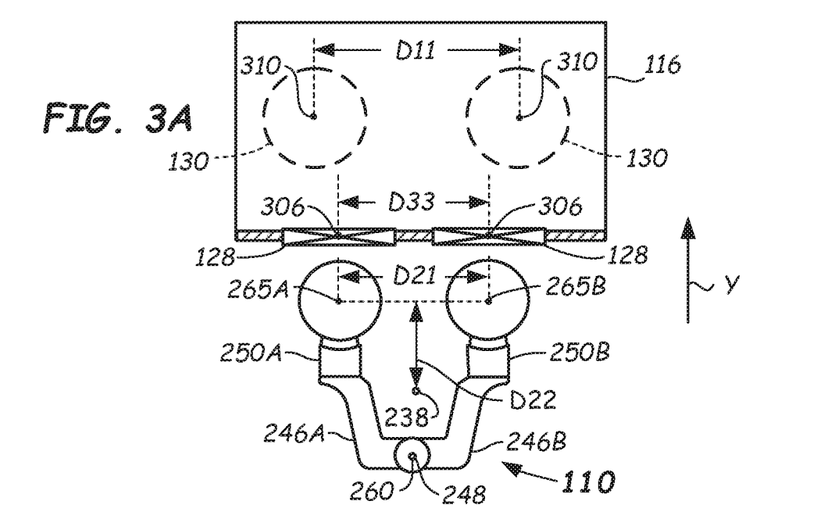
FIG. 3A illustrates a top view of a portion of a robot apparatus approaching a process chamber according to the disclosed embodiments.

The robot apparatus 110 accessing dual processing locations 130 within a processing chamber 116 is described in greater detail with reference to FIGS. 3A-3C. FIG. 3A illustrates a top view of the first wrist member 246A and the second wrist member 246B of the robot apparatus 110 oriented to access a process chamber 116. In FIG. 3A, the first wrist member 246A and the second wrist member 246B may be approaching the process chamber 116. For example, the first wrist member 246A and the second wrist member 246B may approach the process chamber 116 in a forward Y-direction with the first end effector 250A and the second end effector 250B at a defined pitch. The defined pitch may provide for an end effector distance D21 between the nominal substrate placement center 265A (hereinafter "center") of the first end effector 250A and the center 265B of the second end effector 250B.

The centers 306 of the dual slit valves 128 that provide access into the process chamber 116 are separated by an opening distance D33. The centers 310 of the dual processing locations 130 within the process chamber 116 are separated by a process distance D11. The process distance D11 may be greater than the opening distance D33 and distance D21. The centers 265A, 265B of the end effectors or the substrates 112 located thereon may be a distance D22 from the first rotational axis 238 in the Y direction. The end effectors are spaced an end effector distance D21 from each other when the end effectors are the distance D22 from the first rotational axis 238 (retracted position). The distance D21 may be referred to as a first end effector distance and the first and second end effectors 250A, 250B may be referred to as being a first distance (e.g., distance D22) from the first rotational axis 238. In some embodiments, the distance D21 may not vary as the first end effector 250A and the second end effector 250B approach or recede from the dual slit valves 128 so that the distance D21 is equal or substantially equal to the distance D33. However, the cam profiles can be designed such that some rotation can be accomplished when moving towards and/or through the dual slit valves 128, so distance D33 can be larger than distance D21.

Figure 3B:
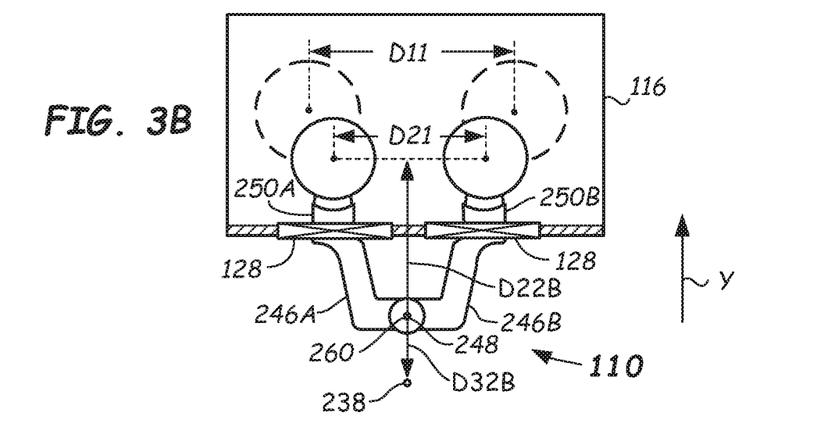
FIG. 3B illustrates a top view of the portion of the robot apparatus of FIG. 3A passing through a pair of slit valves according to the disclosed embodiments.

FIG. 3B illustrates a top view of the first end effector 250A and the second end effector 250B passing through dual slit valves 128 according to the disclosed embodiments. As the first end effector 250A and the second end effector 250B pass through the dual slit valves 128, the distance D21 changes. As shown in FIG. 3B, the first end effector 250A and the second end effector 250B are located a distance D22B from the first rotational axis 238. At the distance D22B, the end effector pitch starts to transition from pitch D21 to the processing distance D11.

Figure 3C:
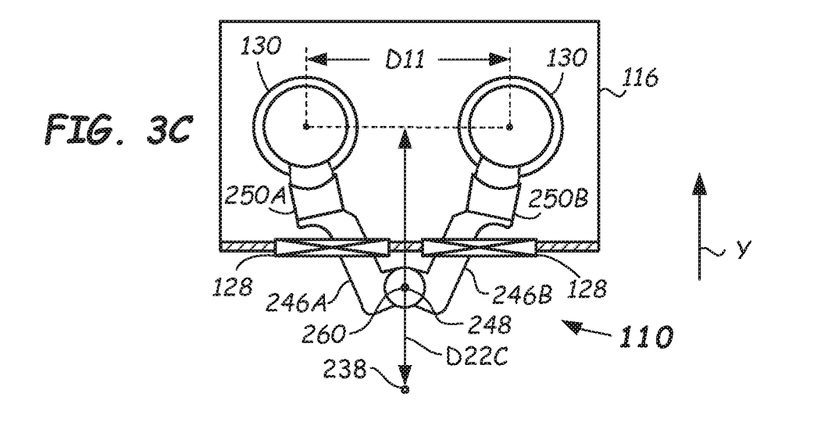
FIG. 3C illustrates a top view of the portion of the robot apparatus of FIG. 3A accessing a pair of processing locations spaced a distance apart according to the disclosed embodiments.

FIG. 3C illustrates a top view of arms of the first end effector 250A and the second end effector 250B accessing dual processing locations 130 according to the disclosed embodiments. As the first end effector 250A and the second end effector 250B continue further in the forward Y-direction and have passed through the dual slit valves 128, the end effector pitch (e.g., distance D21) changes. The first end effector 250A and the second end effector 250B are a distance D22C from the first rotational axis 238 and are separated by the distance equal to processing distance D11. For example, the first wrist member 246A and the second wrist member 246B are each rotated outward about the third rotational axis 248 until the first end effector 250A and the second end effector 250B are separated by the distance D11. When the first end effector 250A and the second end effector 250B have transitioned to the distance D11, the substrates 112 on the first end effector 250A and the second end effector 250B may be simultaneously placed on or removed from the dual processing locations 130. The distance D11 between the first end effector 250A and the second end effector 250B may be referred to as a second end effector distance. The first end effector 250A and the second end effector 250B may be referred to as being a second distance D22C from the first rotational axis 238.

In some embodiments, the distance D21 is referred to as the first end effector distance or the first end effector pitch and may be in a range from 20 inches to 24 inches (51 cm to 61 cm). In some embodiments, the distance D21 is about 22 inches (56 cm). In some embodiments, the distance D11 is referred to as the second end effector distance or the second end effector pitch and may be in a range from 26 inches to 30 inches (66 cm to 76 cm). In some embodiments, the distance D11 is about 28 inches (71 cm). In some embodiments, the distance D22B refers to a first distance between the first end effector 250A and the second end effector 250B and the first rotational axis 238. In some embodiments, the distance D22B is equal to or less than 39 inches (99 cm). In some embodiments, the distance D22C refers to a second distance between the first end effector 250A and the second end effector 250B and the first rotational axis 238. In some embodiments, the distance D22C is in a range from 41 inches to 43 inches (104 cm to 109 cm). In some embodiments, the distance D22C is about 42 inches (107 cm). In some embodiments, the difference between the distance D22B and the distance D22C is in a range from two inches to four inches (5 cm to 10 cm). In some embodiments, the difference between the distance D22B and the distance D22C is about three inches (7.6 cm).

Figure 4:
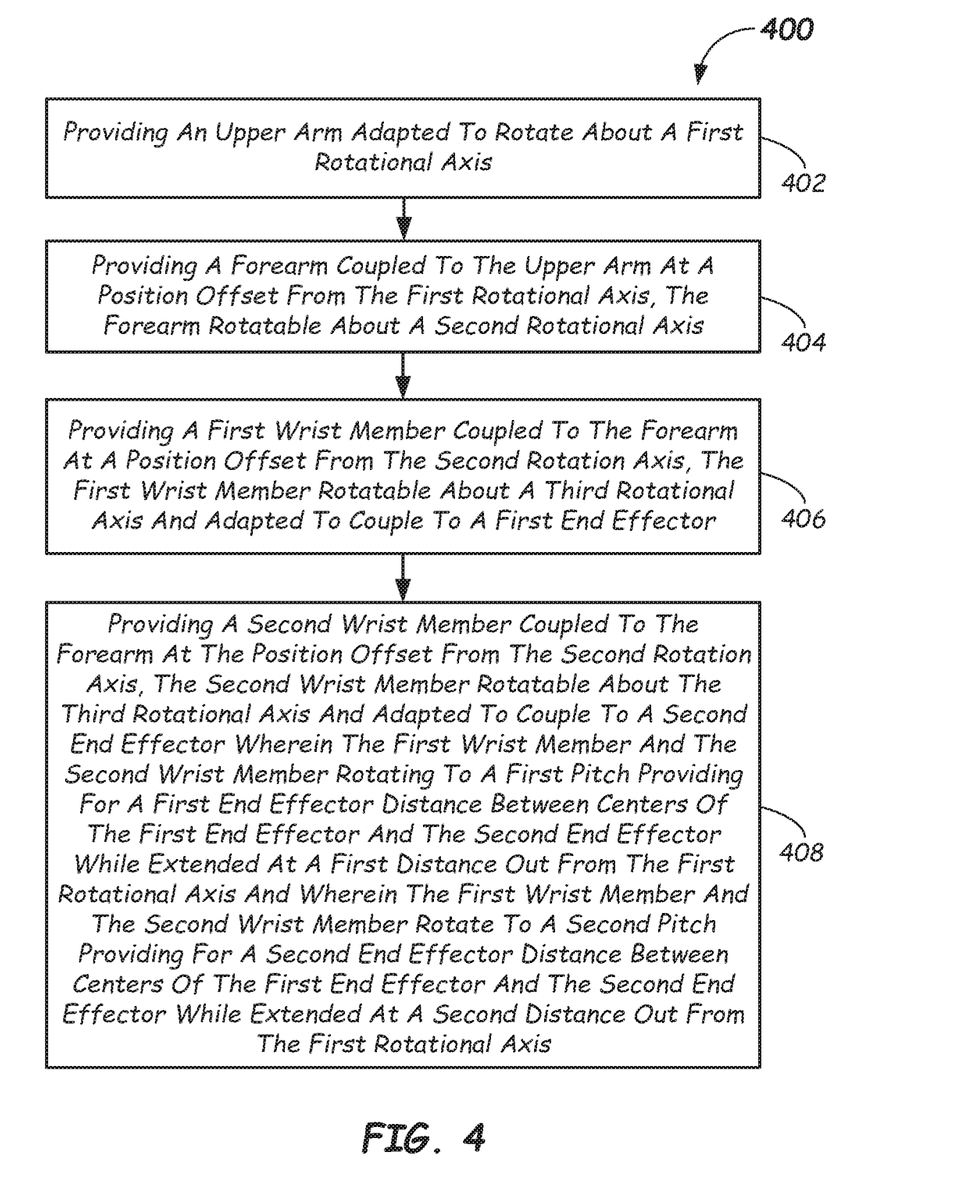
FIG. 4 illustrates a flowchart depicting a method of making a robot apparatus according to the disclosed embodiments.

FIG. 4 illustrates a flowchart depicting a method 400 of manufacturing a robot apparatus (e.g., robot apparatus 110) according to the disclosed embodiments. The method 400 may include, at 402, providing an upper arm (e.g., upper arm 236) adapted to rotate about a first rotational axis (e.g., first rotational axis 238). The method 400 may include, at 404, providing a forearm (e.g., forearm 242) coupled to the upper arm (e.g., upper arm 236) at a position offset from the first rotational axis (e.g., first rotational axis 238), the forearm (e.g., forearm 242) rotatable about a second rotational axis (e.g., second rotational axis 244).

The method 400 may include, at 406, providing a first wrist member (e.g., first wrist member 246A) coupled to the forearm (e.g., forearm 242) at a position offset from the second rotation axis (e.g., second rotational axis 244), the first wrist member (e.g., first wrist member 246A) rotatable about a third rotational axis (e.g., third rotational axis 248) and adapted to couple to a first end effector (e.g., first end effector 250A).

The method 400 may include, at 408, providing a second wrist member (e.g., second wrist member 246B) coupled to the forearm (e.g., forearm 242) at the position offset from the second rotation axis (e.g., second rotation axis 244), the second wrist member (e.g., second wrist member 246B) rotatable about the third rotational axis (e.g., third rotational axis 248) and adapted to couple to a second end effector (e.g., second end effector 250B) wherein the first wrist member (e.g., first wrist member 246A) and the second wrist member (e.g., second wrist member 246B) rotate to a first pitch providing for a first end effector distance (e.g., distance D21) between centers (e.g., centers 265A, 265B) of the first end effector (e.g., first end effector 250A) and the second end effector (e.g., second end effector 250B) while at a first distance out (e.g., D22B) from the first rotational axis (e.g., while simultaneously passing through a dual slit valve (e.g., dual slit valves 128)) and wherein the first wrist member (e.g., first wrist member 246A) and the second wrist member (e.g., second wrist member 246B) rotate to a second pitch providing for a second end effector distance (e.g., processing distance D11) between centers of the first end effector (e.g. first end effector 250A) and the second end effector (e.g., second end effector 250B) while extended at a second distance out from the first rotational axis (e.g., D11, such as while simultaneously accessing dual processing locations (e.g., processing locations 130)).

Figure 5:
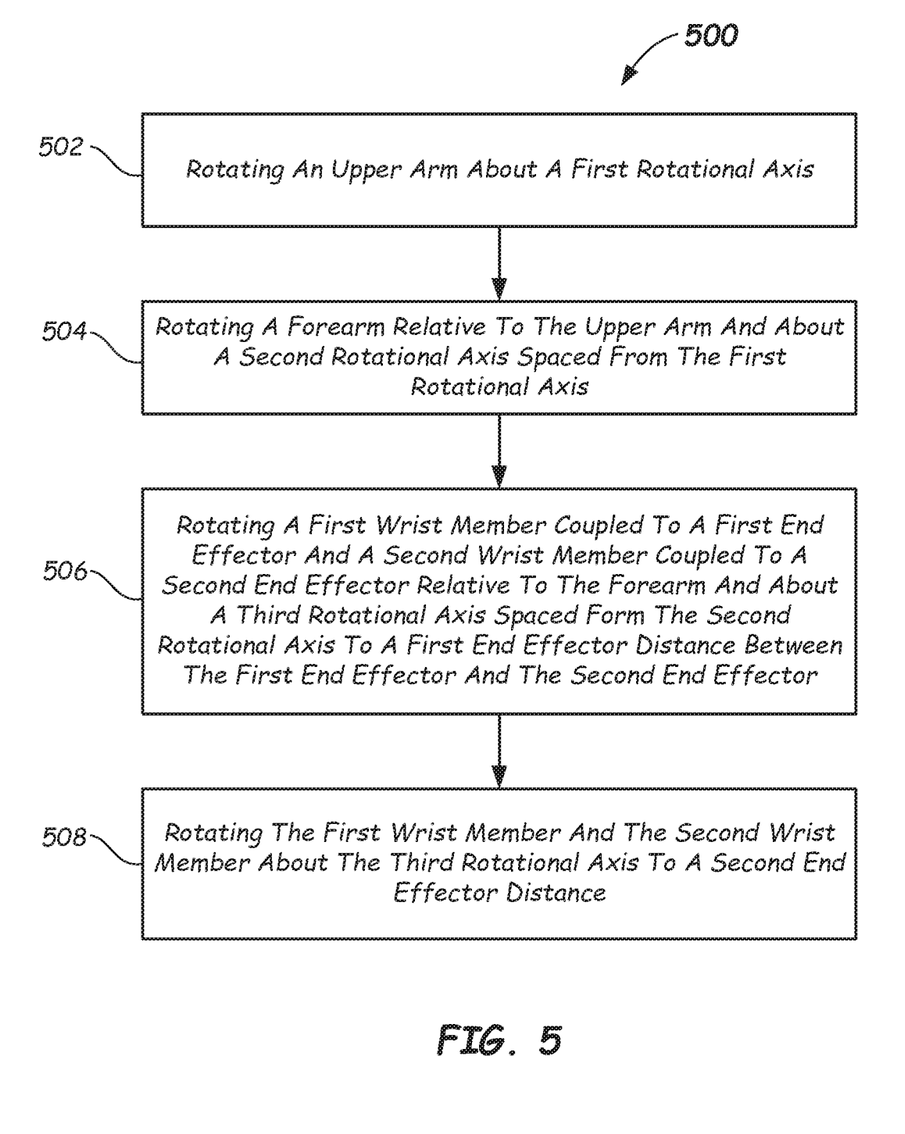
FIG. 5 illustrates a flowchart depicting a method of operating a robot apparatus according to the disclosed embodiments.

FIG. 5 illustrates a flowchart describing a method 500 of operating a robot apparatus (e.g., robot apparatus 110). The method 500 includes, in 502, rotating an upper arm (e.g., upper arm 236) about a first rotational axis (e.g., first rotational axis 238). The method 500 includes, in 504, rotating a forearm (e.g., forearm 242) relative to the upper arm and about a second rotational axis (e.g., second rotational axis 244) spaced from the first rotational axis. The method 500 includes, in 506, rotating a first wrist member (e.g., first wrist member 246A) coupled to a first end effector (e.g., first end effector 250A) and a second wrist member (e.g., second wrist member 246B) coupled to a second end effector (e.g., second end effector 250B) relative to the forearm about a third rotational axis (e.g., third rotational axis 248) spaced form the second rotational axis to a first end effector distance (e.g., distance D21) between the first end effector and the second end effector. The method 500 includes, at 508, rotating the first wrist member and the second wrist member about the third rotational axis to a second end effector distance (e.g., processing distance D11).

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A robot apparatus, comprising:
an upper arm adapted to rotate about a first rotational axis;
a forearm rotatably coupled to the upper arm at a second rotational axis, the second rotational axis spaced from the first rotational axis;
a first wrist member rotatably coupled to the forearm at a third rotational axis, the third rotational axis spaced from the second rotational axis;
a first end effector coupled to the first wrist member;
a second wrist member rotatably coupled to the forearm at the third rotational axis;
a second end effector coupled to the second wrist member;
wherein the first wrist member and the second wrist member are configured to provide a first pitch comprising a first end effector distance between the first end effector and the second end effector while the first end effector and the second end effector are extended a first distance from the first rotational axis to concurrently enter adjacent slit valves of a processing chamber; and
wherein the first wrist member and the second wrist member are configured to rotate dependently in relation to each other about the third rotational axis to a second pitch comprising a second end effector distance between the first end effector and the second end effector while the first end effector and the second end effector are extended a second distance from the first rotational axis to concurrently place substrates on adjacent processing locations within the processing chamber, wherein the first end effector distance is different than the second end effector distance.

2. The robot apparatus of claim 1, wherein the first wrist member is L-shaped and includes a first leg and a second leg that is longer than the first leg, and wherein the first leg is rotatably coupled to the forearm at the third rotational axis and the second leg is coupled to the first end effector.

3. The robot apparatus of claim 1, wherein the second wrist member is L-shaped and includes a first leg and a second leg that is longer than the first leg, the first leg comprising a bend that vertically connects the first leg and the second leg, wherein the first leg is rotatably coupled to the forearm at the third rotational axis and the second leg is coupled to the second end effector, and wherein the bend has a length such that the first end effector and the second end effector are located on a same plane.

4. The robot apparatus of claim 1, wherein oblong pulleys are implemented to transition the first wrist member and the second wrist member between the first pitch and the second pitch.

5. The robot apparatus of claim 4, wherein the oblong pulleys include cam surfaces.

6. The robot apparatus of claim 1, wherein the first end effector distance is in a range from 51 cm to 61 cm and the second end effector distance is in a range from 66 cm to 76 cm.

7. The robot apparatus of claim 1, wherein a difference between the first end effector distance and the second end effector distance is in a range from 5 cm to 10 cm.

8. The robot apparatus of claim 1, further comprising a first motor that rotates the upper arm about the first rotational axis and a second motor that rotates the forearm about the second rotational axis.

9. An electronic device processing system, comprising:
a transfer chamber including a plurality of facets, one or more of the plurality of facets including dual openings with centers separated by an opening distance;
one or more process chambers coupled to the plurality of facets, one or more of the process chambers including dual processing locations having centers separated by a processing distance, the processing distance being greater than the opening distance;
a robot apparatus at least partially enclosed within the transfer chamber, the robot apparatus comprising:
an upper arm adapted to rotate about a first rotational axis;
a forearm rotatably coupled to the upper arm at a second rotational axis, the second rotational axis spaced from the first rotational axis;
a first wrist member rotatably coupled to the forearm at a third rotational axis, the third rotational axis spaced from the second rotational axis;
a first end effector coupled to the first wrist member;
a second wrist member rotatably coupled to the forearm at the third rotational axis;
a second end effector coupled to the second wrist member;
wherein the first wrist member and the second wrist member are configured to provide a first pitch comprising a first end effector distance between the first end effector and the second end effector that is approximately equal to the opening distance while the first end effector and the second end effector are extended a first distance from the first rotational axis to concurrently enter the transfer chamber; and
wherein the first wrist member and the second wrist member are configured to rotate dependently in relation to each other about the third rotational axis to a second pitch comprising a second end effector distance between the first end effector and the second end effector that is approximately equal to the processing distance while the first end effector and the second end effector are extended a second distance from the first rotational axis to concurrently place substrates on the dual processing locations, wherein the first end effector distance is different than the second end effector distance.

10. The electronic device processing system of claim 9, wherein one or more process chambers are configured to perform one of vapor deposition/atomic layer deposition and physical vapor deposition.

11. The electronic device processing system of claim 9, wherein the transfer chamber is a vacuum.

12. The electronic device processing system of claim 9, wherein the first wrist member is L-shaped and includes a first leg and a second leg that is longer than the first leg, and wherein the first leg is rotatably coupled to the forearm at the third rotational axis and the second leg is coupled to the first end effector.

13. The electronic device processing system of claim 9, wherein the second wrist member is L-shaped and includes a first leg and a second leg that is longer than the first leg, the first leg comprising a bend that vertically connects the first leg and the second leg, wherein the first leg is rotatably coupled to the forearm at the third rotational axis and the second leg is coupled to the second end effector, and wherein the bend has a length such that the first end effector and the second end effector are located on a same plane.

14. The electronic device processing system of claim 9, wherein oblong pulleys are implemented to transition the first wrist member and the second wrist member between the first pitch and the second pitch.

15. The electronic device processing system of claim 14, wherein the oblong pulleys include cam surfaces.

16. The robot apparatus of claim 9, wherein the first end effector distance is in a range from 51 cm to 61 cm and the second end effector distance is in a range from 66 cm to 76 cm.

17. The robot apparatus of claim 9, wherein a difference between the first end effector distance and the second end effector distance is in a range from 5 cm to 10 cm.

18. A method of operating a robot apparatus, comprising:

rotating an upper arm of a robot apparatus about a first rotational axis;

rotating a forearm relative to the upper arm and about a second rotational axis spaced from the first rotational axis;

rotating a first wrist member coupled to a first end effector and a second wrist member coupled to a second end effector relative to the forearm and about a third rotational axis spaced from the second rotational axis to a first end effector distance between the first end effector and the second end effector while the first end effector and the second end effector are extended a first distance from the first rotational axis to concurrently enter adjacent slit valves of a processing chamber; and dependently rotating the first wrist member and the second wrist member in relation to each other about the third rotational axis to a second end effector distance while the first end effector and the second end effector are extended a second distance from the first rotational axis to concurrently place substrates on adjacent processing locations within the processing chamber, wherein the first end effector distance is different than the second end effector distance.

* * * * *